United States Patent
Kim

(10) Patent No.: US 8,203,204 B2
(45) Date of Patent: Jun. 19, 2012

(54) STACKED SEMICONDUCTOR PACKAGE

(75) Inventor: Jong Hoon Kim, Gyeonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 13/170,586

(22) Filed: Jun. 28, 2011

(65) Prior Publication Data

US 2011/0254145 A1 Oct. 20, 2011

Related U.S. Application Data

(62) Division of application No. 11/954,027, filed on Dec. 11, 2007, now Pat. No. 7,994,621.

(30) Foreign Application Priority Data

Nov. 13, 2007 (KR) .................. 10-2007-0115700

(51) Int. Cl.
*H01L 23/02* (2006.01)
(52) U.S. Cl. .............. 257/686; 257/67; 257/E27.138; 257/E27.094; 257/E27.086
(58) Field of Classification Search .............. 257/67, 257/686, E27.138, E27.094, E27.086
See application file for complete search history.

(56) References Cited

U.S. PATENT DOCUMENTS

| | | | |
|---|---|---|---|
| 5,809,416 A | 9/1998 | Pinault et al. | |
| 6,347,039 B1 | 2/2002 | Lee | |
| 6,900,528 B2 | 5/2005 | Mess et al. | |
| 7,229,856 B2 | 6/2007 | Oi et al. | |
| 7,247,935 B2 | 7/2007 | Kawano | |
| 7,335,974 B2 | 2/2008 | Hwang et al. | |
| 7,405,472 B2 | 7/2008 | Kawano | |
| 7,436,069 B2 | 10/2008 | Matsui | |
| 7,462,930 B2 | 12/2008 | Lee et al. | |
| 2002/0195697 A1 | 12/2002 | Mess et al. | |
| 2004/0027869 A1 | 2/2004 | Miwa et al. | |
| 2009/0127716 A1 | 5/2009 | Takatsuki | |

FOREIGN PATENT DOCUMENTS

| | | |
|---|---|---|
| CN | 1845324 A | 10/2006 |
| JP | 05-211281 A | 8/1993 |
| KR | 20020039012 A | 8/1993 |
| WO | 2006/127782 A1 | 11/2006 |
| WO | 2007/079121 A2 | 7/2007 |

OTHER PUBLICATIONS

USPTO OA mailed Nov. 12, 2008 in connection with U.S. Appl. No. 11/954,027.

(Continued)

*Primary Examiner* — N Drew Richards
*Assistant Examiner* — Joannie A Garcia
(74) *Attorney, Agent, or Firm* — Ladas & Parry LLP

(57) ABSTRACT

A stacked semiconductor package provides an enhanced data storage capacity along with an improved data processing speed. The stacked semiconductor package includes a substrate having chip selection pads and a connection pad; a semiconductor chip module including a plurality of semiconductor chips including data bonding pads, a chip selection bonding pad, and data redistributions electrically connected with the data bonding pads and a data through electrode passing through the data bonding pad and connected with the data redistribution, the semiconductor chips being stacked so as to expose the chip selection bonding pad; and a conductive wire for connecting electrically the chip selection pad and the chip selection bonding pads.

6 Claims, 7 Drawing Sheets

OTHER PUBLICATIONS

USPTO OA mailed Apr. 2, 2009 in connection with U.S. Appl. No. 11/954,027.
USPTO OA mailed Oct. 29, 2009 in connection with U.S. Appl. No. 11/954,027.
USPTO FOA mailed May 27, 2010 in connection with U.S. Appl. No. 11/954,027.
USPTO OA mailed Nov. 23, 2010 in connection with U.S. Appl. No. 11/954,027.
USPTO NOA mailed May 17, 2011 in connection with U.S. Appl. No. 11/954,027.

STACKED SEMICONDUCTOR PACKAGE

CROSS-REFERENCE TO RELATED APPLICATIONS

The present application claims priority to Korean patent application number 10-2007-00115700 filed on Nov. 13, 2007, which is incorporated herein by reference in its entirety.

BACKGROUND OF THE INVENTION

The present invention relates to a stacked semiconductor package.

Recently, with a development of a semiconductor fabrication technology, there has been developed various semiconductor packages having a semiconductor device adapted to process massive amounts of data in a relatively short time period.

Recently, there has been a stacked semiconductor package in which a plurality of semiconductor chips is stacked and electrically connected in order to enhance data storage capacity and data processing speed in the semiconductor package.

In order to realize the stacked semiconductor package, a technology to selectively apply a control signal or a data signal to a specific semiconductor chip of the plurality of the semiconductor chips is needed.

SUMMARY OF THE INVENTION

Embodiments of the present invention are directed to a stacked semiconductor package which is capable of operating in a high speed by providing a data signal to a semiconductor chip through a through electrode and providing a chip selection signal to a semiconductor chip through a conductive wire.

In one embodiment, a stacked semiconductor package comprises a substrate having chip selection pads and a connection pad; a semiconductor chip module including a plurality of semiconductor chips each having data bonding pads, a chip selection bonding pad, and data redistribution units electrically connected with the data bonding pads and a data through electrode passing through the data bonding pad and connected with the data redistribution unit, the semiconductor chips being stacked so as to expose the chip selection bonding pad; and a conductive wire for connecting electrically the chip selection pad and the chip selection bonding pads.

When a number of the stacked semiconductor chips is $2^N$ (N is a natural number of more than 2), each semiconductor chip includes N chip selection bonding pads.

The stacked semiconductor package may further comprise a chip selection redistribution unit connected with the chip selection bonding pad.

The stacked semiconductor package may further comprise a chip selection through electrode passing through the chip selection bonding pad.

The chip selection pad includes a ground voltage pad applied with a ground voltage (Vss) and a power voltage pad applied with a power voltage (Vcc).

An address signal, a power signal, a data signal and a control signal are input to the data redistribution unit.

A conductive connection member is interposed between the data redistribution unit and the through electrode.

The conductive connection member is a solder.

In another embodiment, a stacked semiconductor package comprises a substrate having a connection pad and chip selection pad; a plurality of semiconductor chips stacked over the substrate, each semiconductor chip having data bonding pads and chip selection bonding pads disposed over an edge thereof; a spacer interposed between the semiconductor chips and spacing the adjacent semiconductor chips apart from each other; through electrodes passing through the semiconductor chips and connected with the data bonding pads and the connection pad; and a conductive wire for connecting electrically the chip selection pad and the chip selection bonding pads.

Each through electrode projects from the semiconductor chip correspondingly to a thickness of the spacer.

Alternatively, a length of the through electrode is substantially equal to a thickness of the semiconductor chip and a conductive connection member is interposed between the through electrodes spaced by the spacer.

The conductive connection member is solder.

When a number of the stacked semiconductor chips is $2^N$ (N is a natural number of more than 2), each semiconductor chip includes N chip selection bonding pads and chip selection redistribution units.

The chip selection pad includes a ground voltage pad applied with a ground voltage (Vss) and a power voltage pad applied with a power voltage (Vcc).

DESCRIPTION OF SPECIFIC EMBODIMENTS

Figure 1:
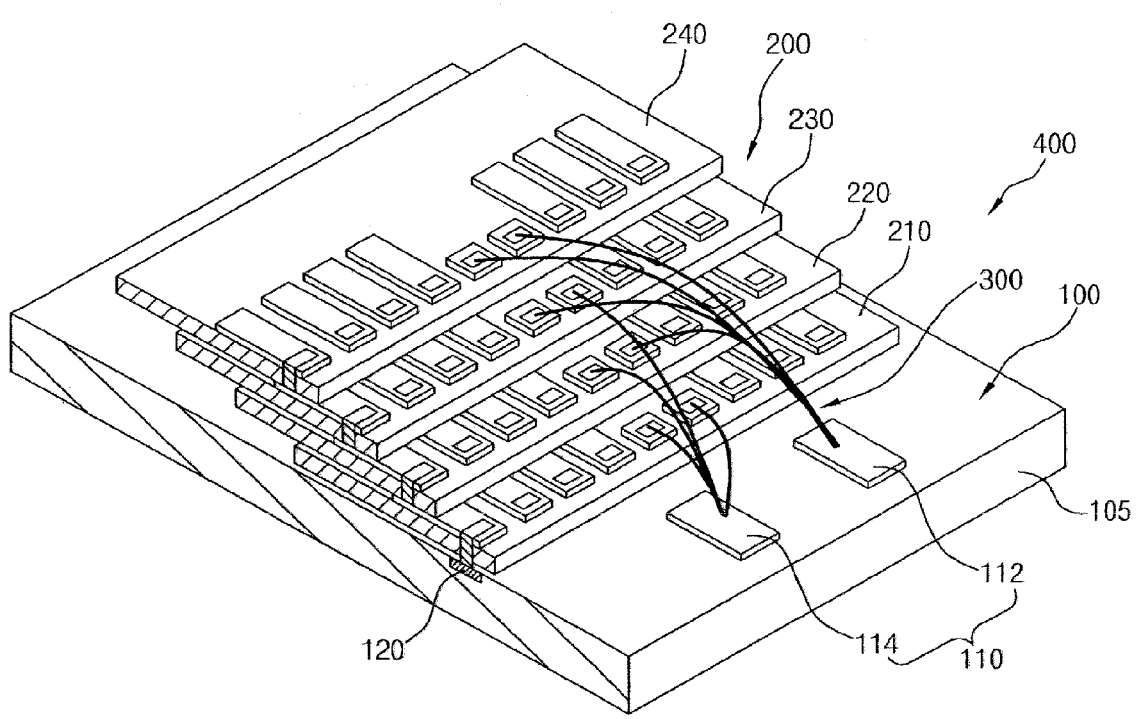
FIG. 1 is a perspective view illustrating a stacked semiconductor package in accordance with an embodiment of the present invention.

FIG. 1 is a perspective view illustrating a stacked semiconductor package in accordance with an embodiment of the present invention.

Referring to FIG. 1, a stacked semiconductor package 400 includes a substrate 100, a semiconductor chip module 200 and a conductive wire 300.

Figure 2:
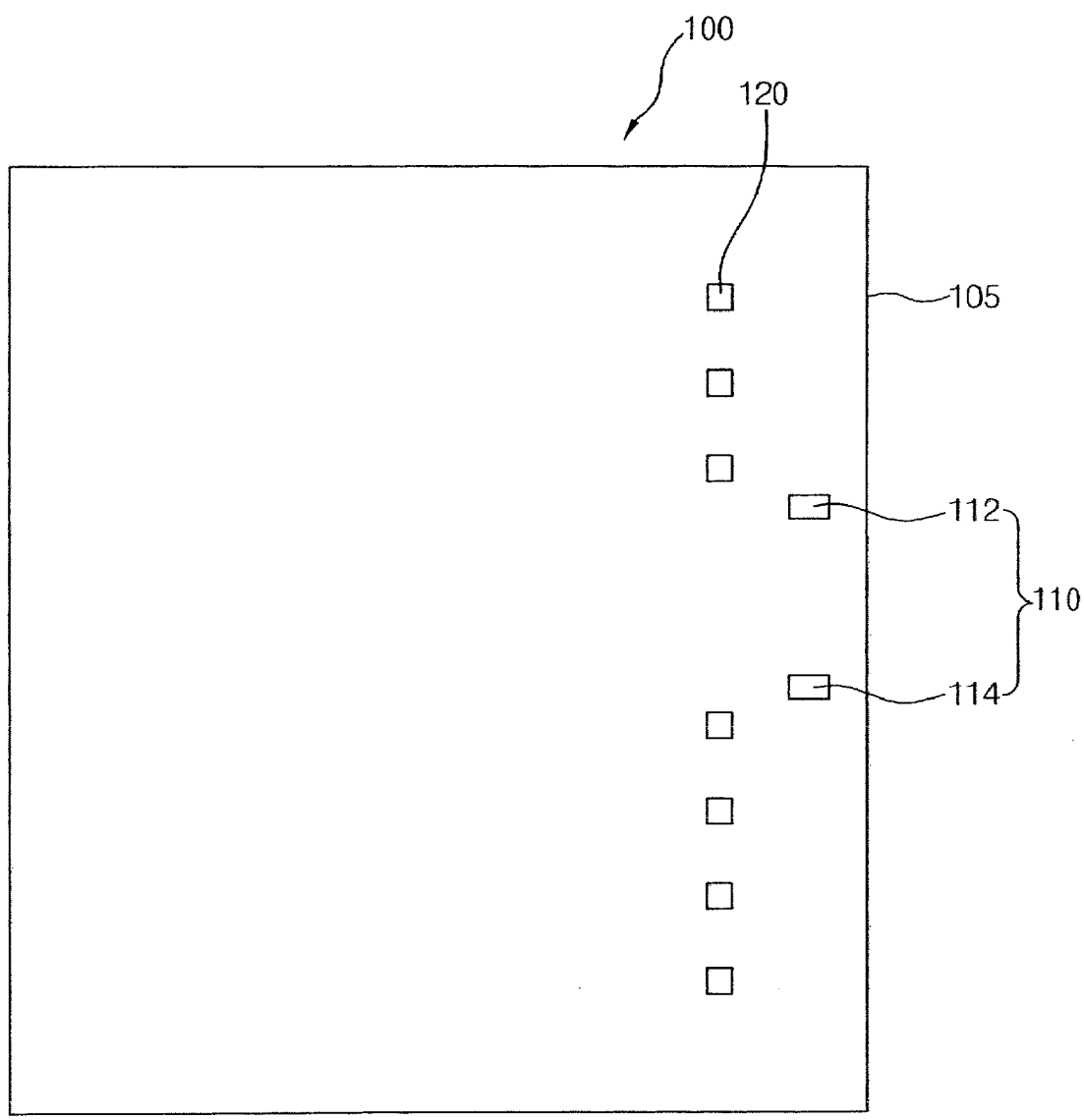
FIG. 2 is a plan view of a substrate shown in FIG. 1.

FIG. 2 is a plan view of a substrate shown in FIG. 1.

Referring to FIGS. 1 and 2, the substrate 100 includes a substrate body 105, a chip selection pad 11') and a connection pad 120. In addition, the substrate 100 may further include a ball land pad and a solder ball.

The substrate body 105 has a plate shape. The substrate body 105 may have a rectangular shape when viewed from the top thereof and the substrate body 105 may be a printed circuit board (PCB).

The chip selection pad 110 is arranged along an edge of an upper surface of the substrate body 105. For example, the chip selection pad 110 may be disposed at a center portion of an edge of the upper surface of the substrate body 105.

The chip selection pad 110 may include a ground voltage pad 112 applied with a ground voltage Vss and a power voltage pad 114 applied with a power voltage Vcc.

In the present embodiment, a number of the chip selection pad 110 is determined by a number of a semiconductor chip included in the semiconductor chip module 200 which will be described later. In the present illustrated embodiment, the number of the chip selection pads 110 is 2 so that the number of the semiconductor chip included in the semiconductor chip module 200 can be up to 4. Likewise in a similar manner when the number of the chip selection pad 110 is 3 then the number of the semiconductor chips included in the semiconductor chip module 200 can be up to 8; and when the number of the chip selection pad 110 is 4 then the number of the semiconductor chip included in the semiconductor chip module 200 can be up to 16.

The chip selection pad 110 can be arranged along the edge of the upper surface of the substrate body 105 and a plurality of the connection pads 120 can be disposed at both sides of the chip selection pad 110 respectively.

Figure 3:
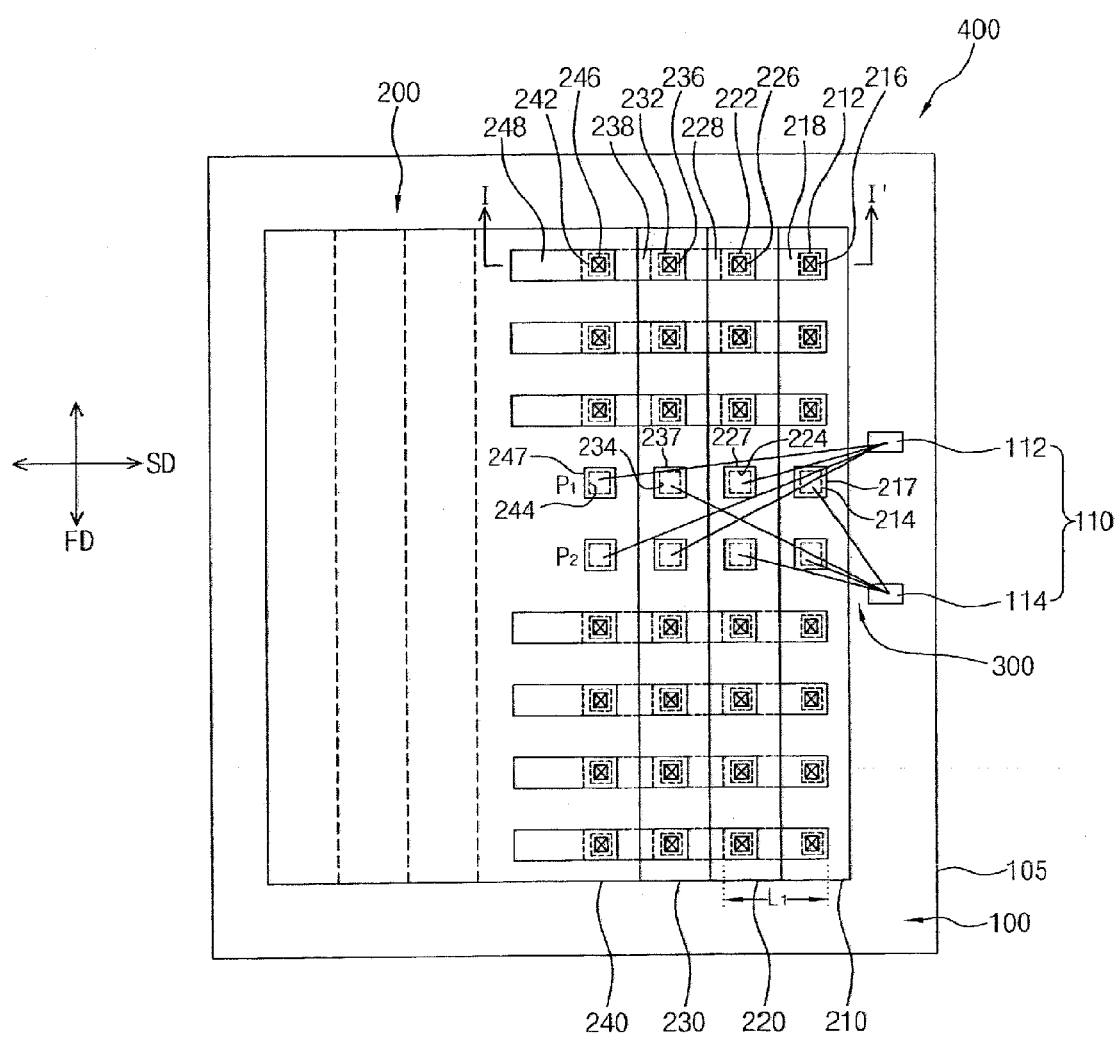
FIG. 3 is a plan view of FIG. 1.
Figure 4:
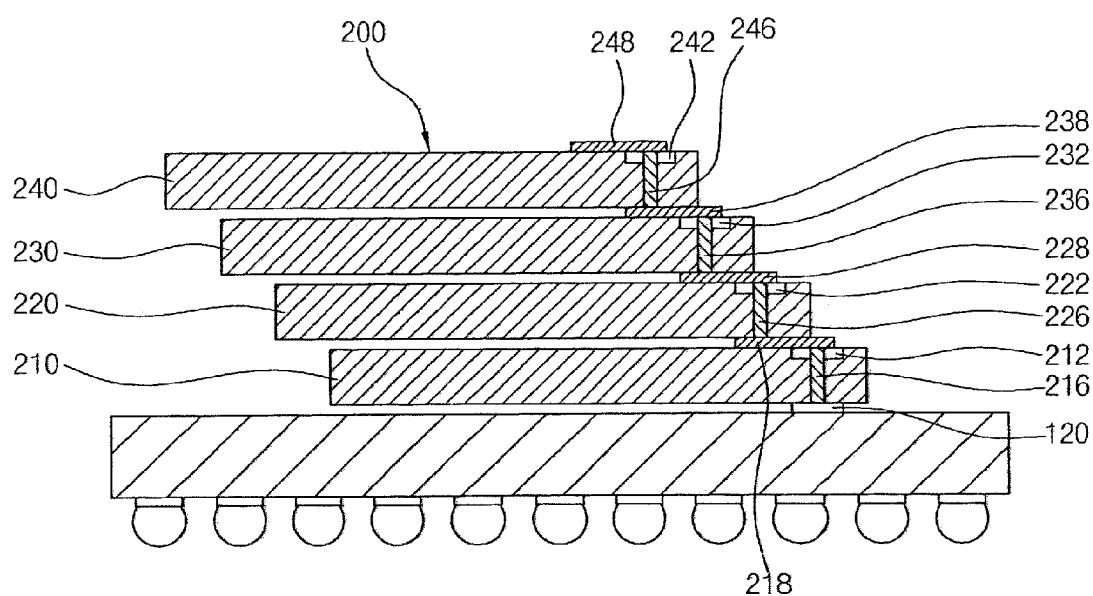
FIG. 4 is a cross-sectional view taken along a line I-I' in FIG. 3.

FIG. 3 is a plan view of FIG. 1. FIG. 4 is a cross-sectional view taken along a line I-I' in FIG. 3.

Referring to FIGS. 3 and 4, the semiconductor chip module 200 is disposed over the upper surface of the substrate body 105.

The semiconductor chip module 200 includes a plurality of semiconductor chips (210, 220, 230, 240). In the present embodiment, the semiconductor chip module 200 may include up to $2^N$ (N is a natural number of more than 1) semiconductor chips. For example, the semiconductor chip module 200 may include up to 2 (when N is 1), up to 4 (when N is 2), up to 8 (when N is 3), up to 16 (when N is 4) or up to 32 (when N is 5) semiconductor chips.

In the present embodiment, the semiconductor chip module 200 includes, for example, 4 semiconductor chips (210, 220, 230, 240).

Hereafter, the 4 semiconductor chips included the semiconductor chip module 200 are referred to as a first semiconductor chip 210, a second semiconductor chip 220, a third semiconductor chip 230 and a fourth semiconductor chip 240.

The first semiconductor chip 210 disposed over the substrate 100 includes a first data bonding pad 212; a first chip selection bonding pad 214; a first data through electrode 216; and a first data redistribution unit 218. To the data bonding pad 212, an address signal, a power signal, a data signal and a control signal are input through the connection pad 120 of the substrate body 105.

The first data bonding pads 212 and the first chip selection bonding pads 214 are arranged along an edge of an upper surface of the first semiconductor chip 210. For example, the first data bonding pads 212 and the first chip selection bonding pads 214 are arranged along a first direction.

The first data bonding pads 212 are disposed at positions corresponding to the each connection pad 120 of the substrate body 105 shown in FIG. 2, and the first chip selection bonding pads 214 are disposed at positions corresponding to the each chip selection pad 110 of the substrate body 105 shown in FIG. 2.

The first data through electrode 216 passes through the first data bonding pad 212 and through the first semiconductor chip 210. Consequently, the first data through electrode 216 of the first semiconductor chip 210 is electrically connected with the connection pad 120 of the substrate body 105. A connection member such as solder may be interposed between the connection pad 120 and the first data through electrode 216.

The first data redistribution unit 218 is disposed over an upper surface of the first semiconductor chip 210. A first end portion of the first data redistribution unit 218 is electrically connected with the first data through electrode 216. A second end portion opposing the first end portion of the first data redistribution unit 218 extends to a first length, L1, toward a second direction, SD, perpendicular to the first direction, FD.

The first semiconductor chip 210 may also further include a first chip selection redistribution unit 217. The first chip selection redistribution unit 217 may be formed at a position corresponding to the first chip selection bonding pad 214 of the first semiconductor chip 210. The first chip selection redistribution unit 217 has a second length shorter than the first length, L1, in the second direction, SD. Additionally, the first chip selection bonding pad 214 may include a first chip selection through electrode passing through the first chip selection bonding pad 214.

The second semiconductor chip 220 includes a second data bonding pad 222, a second chip selection bonding pad 224; a second data through electrode 226; and a second data redistribution unit 228.

The second semiconductor chip 220 is disposed over the first semiconductor chip 210 in a stepped manner and thus the first chip selection bonding pad 214 or the first chip selection redistribution unit 217 is exposed by the second semiconductor chip 220.

The second data bonding pads 222 and the second chip selection bonding pads 224 are arranged along an edge of an upper surface of the second semiconductor chip 220 which is adjacent to the first data bonding pad 212 and the first chip selection bonding pad 214. For example, the second data bonding pads 222 and the second chip selection bonding pads 224 are arranged along the first direction FD. The second data bonding pad 222 is disposed over the first data redistribution unit 218.

The second data through electrode 226 passes through the second data bonding pad 222 and the second semiconductor chip 220. Consequently, the second data through electrode 226 is electrically connected with the first data redistribution unit 218. A conductive connection member (not shown) may be interposed between the second data through electrode 226 and the first data redistribution unit 218. An example of material that may be used as the conductive connection material includes solder.

The second data redistribution unit 228 is disposed over an upper surface of the second semiconductor chip 220. A first end portion of the second data redistribution unit 228 is electrically connected with the second data through electrode 226. A second end portion opposing to the first end portion of the second data redistribution unit 228 extends to the first length L1 toward the second direction SD perpendicular to the first direction FD.

The second semiconductor chip 220 may also further include a second chip selection redistribution unit 227. The second chip selection redistribution unit 227 may be formed at a position corresponding to the second chip selection bonding pad 224 of the second semiconductor chip 220. The second chip selection redistribution unit 227 is formed at a second length shorter than the first length L1 in the second direction. Additionally, the second chip selection bonding pad 224 may include a second chip selection through electrode (not shown) passing through the second chip selection bonding pad 224.

The third semiconductor chip 230 includes a third data bonding pad 232; a third chip selection bonding pad 234; a third data through electrode 236; and a third data redistribution unit 238. The third semiconductor chip 230 is disposed over the second semiconductor chip 220 in a stepped manner and thus the second chip selection bonding pad 224 or the second chip selection redistribution unit 227 is exposed by the third semiconductor chip 230.

The third data bonding pads 232 and the third chip selection bonding pads 234 are arranged along an edge of an upper surface of the third semiconductor chip 230 which is adjacent to the second data bonding pad 222 and the second chip selection bonding pad 224. For example, the third data bonding pads 232 and the third chip selection bonding pads 234 are arranged along the first direction, FD. The third data bonding pad 232 is disposed over the second data redistribution unit 228.

The third data through electrode 236 passes through the third data bonding pad 232 and the third semiconductor chip 230. Consequently, the third data through electrode 236 is electrically connected with the second data redistribution unit 228. A conductive connection member may be interposed between the third data through electrode 236 and the second data redistribution unit 228. An example of material that may be used as the conductive connection material includes solder.

The third data redistribution unit 238 is disposed over an upper surface of the third semiconductor chip 230. A first end portion of the third data redistribution unit 238 is electrically connected with the third data through electrode 236. A second end portion opposing to the first end portion of the third data redistribution unit 238 extends to the first length, L1, toward the second direction, SD, perpendicular to the first direction, FD.

Meanwhile, the third semiconductor chip 230 may further include a third chip selection redistribution unit 237. The third chip selection redistribution unit 237 may be formed at a position corresponding to the third chip selection bonding pad 234 of the third semiconductor chip 230. The third chip selection redistribution unit 237 is formed to the second length shorter than the first length L1 in the second direction. Additionally, the third chip selection bonding pad 234 may include a third chip selection through electrode passing through the third chip selection bonding pad 234.

The fourth semiconductor chip 240 includes a fourth data bonding pad 242, a fourth chip selection bonding pad 244, a fourth data through electrode 246 and a fourth data redistribution unit 248. The fourth semiconductor chip 240 is disposed over the third semiconductor chip 230 in a stepped shape manner and thus the third chip selection bonding pad 234 or the third chip selection redistribution unit 237 is exposed by the fourth semiconductor chip 240.

The fourth data bonding pads 242 and the fourth chip selection bonding pads 244 are arranged along an edge of an upper surface of the fourth semiconductor chip 240 which is adjacent to the third data bonding pad 232 and the third chip selection bonding pad 234. For example, the fourth data bonding pads 242 and the fourth chip selection bonding pads 244 are arranged along the first direction FD. The fourth data bonding pad 242 is disposed over the third data redistribution unit 238.

The fourth data through electrode 246 passes through the fourth data bonding pad 242 and the fourth semiconductor chip 240 and, consequently, the fourth data through electrode 246 is electrically connected with the third data redistribution unit 238. A conductive connection member (not shown) may be interposed between the fourth data through electrode 246 and the third data redistribution unit 238. An example of material that may be used as the conductive connection material (not shown) includes solder.

The fourth data redistribution unit 248 is disposed over an upper surface of the fourth semiconductor chip 240. A first end portion of the fourth data redistribution unit 248 is electrically connected with the fourth data through electrode 246. A second end portion opposing to the first end portion of the fourth data redistribution unit 248 extends to the first length, L1, toward the second direction, SD, perpendicular to the first direction, FD.

The fourth semiconductor chip 240 may further include a fourth chip selection redistribution unit 247. The fourth chip selection redistribution unit 247 may be formed at a position corresponding to the fourth chip selection bonding pad 244 of the fourth semiconductor chip 240. The fourth chip selection redistribution unit 247 is formed to the second length shorter than the first length L1 in the second direction. Additionally, the fourth chip selection bonding pad 244 may include a fourth chip selection through electrode passing through the fourth chip selection bonding pad 234.

Referring again to FIG. 4, the connection pad 120 of the substrate body 105 is electrically connected with the first data through electrode 216 of the first semiconductor chip 210, and the first data redistribution unit 218, the second data through electrode 226, the second data redistribution unit 228, the third data through electrode 236, the third data redistribution unit 238, the fourth data through electrode 246 and the fourth data redistribution unit 248 are all electrically interconnected together.

Referring again to FIGS. 1 and 3, the conductive wire 300 is electrically connected to the chip selection pad 110 of the substrate body 105 and to the first through fourth chip selection bonding pads 214, 224, 234 and 244 of the first through fourth semiconductor chips 210, 220, 230 and 240.

Table 1 outlines one of the electrical connection layout schemes with the chip selection pad 110 and the first through fourth chip selection bonding pads 214, 224, 234 and 244 by the conductive wire 300.

TABLE 1

|  | Chip selection bonding pad (P1) | Chip selection bonding pad (P2) |
| --- | --- | --- |
| First semiconductor chip | Vss | Vss |
| Second semiconductor chip | Vcc | Vss |
| Third semiconductor chip | Vss | Vcc |
| Fourth semiconductor chip | Vcc | Vcc |

Figure 5:
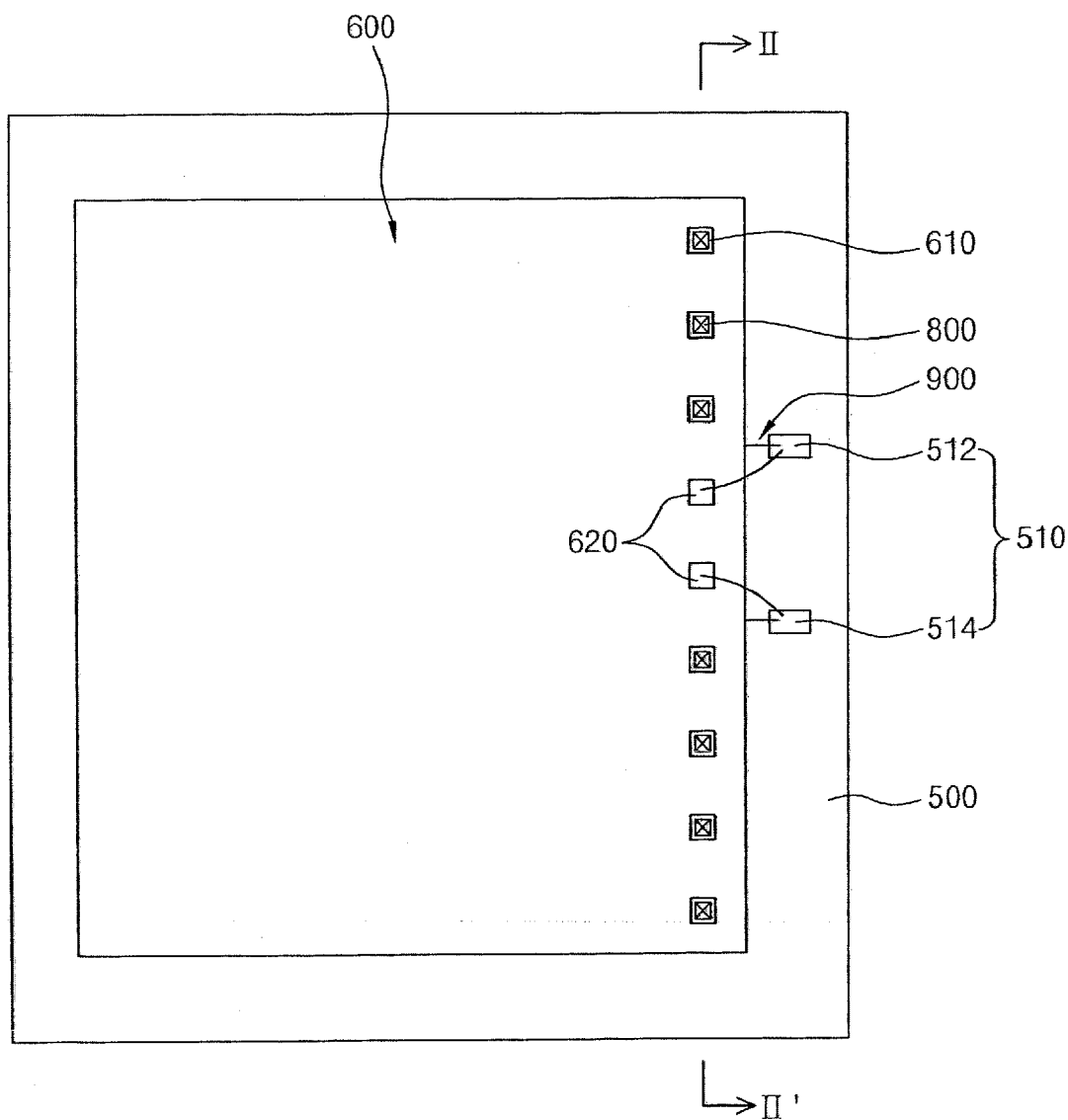
FIG. 5 is a plan view illustrating a stacked semiconductor package in accordance with another embodiment of the present invention.

FIG. 5 is a plan view illustrating a stacked semiconductor package in accordance with another embodiment of the present invention.

Figure 6:
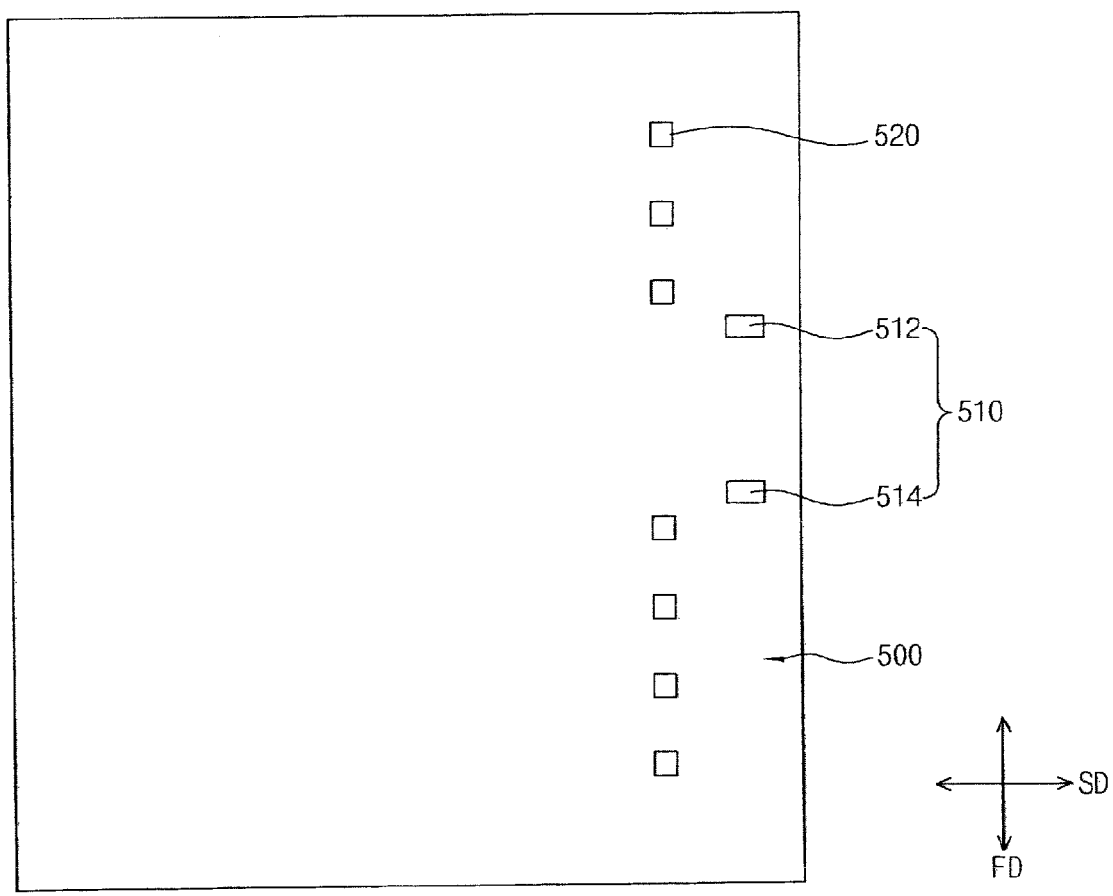
FIG. 6 is a plan view of a substrate shown in FIG. 5.
Figure 7:
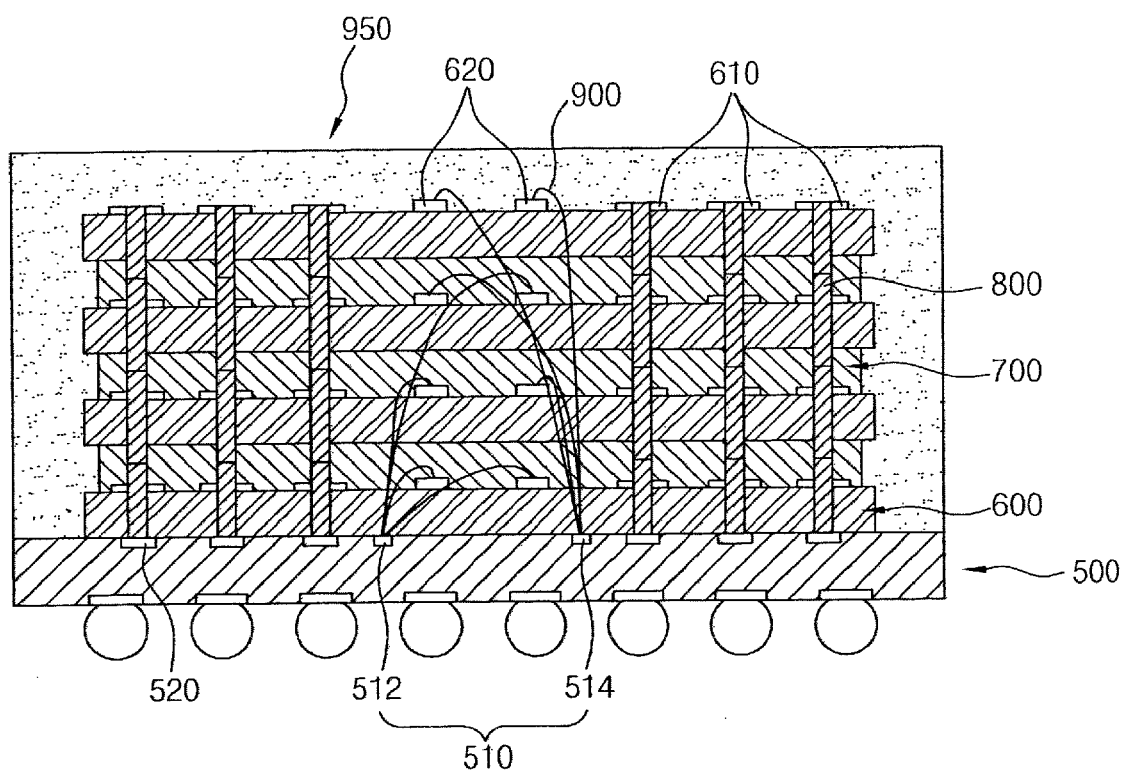
FIG. 7 is a cross-sectional view taken along a line II-II' in FIG. 5.

Referring to FIGS. 5-7, a stacked semiconductor package 950 includes a substrate 500, semiconductor chips 600, spacers 700, through electrodes 800 and conductive wires 900.

FIG. 6 is a plan view of a substrate shown in FIG. 5.

The substrate 500 is a printed circuit board (PCB) having a plate shape. The PCB includes a chip selection pad 510 and a connection pad 520.

The chip selection pad 510 includes a ground voltage pad 512 applied with a ground voltage Vss and a power voltage pad 514 applied with a power voltage Vcc. Although the chip selection pad 510 includes the ground voltage pad 512 and the power voltage pad 514 in the present embodiment, the chip selection pad 510 may include at least three pads.

The semiconductor chips 600 are disposed over an upper surface of the substrate 500 formed with the chip selection pad 510 and the connection pad 520. In the present embodiment, for example, four semiconductor chips 600 are disposed over the upper surface of the substrate 500.

In this presently illustrated embodiment, the four semiconductor chips 600 substantially have the same shape. Each semiconductor chip 600 includes data bonding pads 610 disposed at positions corresponding to the connection pads 520 of the substrate 500 and a chip selection bonding pad 620 disposed at positions corresponding to the chip selection pad 510 of the substrate 500. The data bonding pad 610 and the chip selection bonding pad 620 are arranged along an edge of the upper surface of the semiconductor chip 600 respectively.

FIG. 7 is a cross-sectional view taken along a line II-II' in FIG. 5.

A spacer 700 is interposed between a pair of the adjacent semiconductor chips 600 stacked over the substrate 500. The spacer 700 forms a gap between the adjacent semiconductor chips 600.

The through electrode 800 passes through the data bonding pad 610 formed in the semiconductor chip 600 and through the semiconductor chip 600 corresponding to the data bonding pad 610. The through electrode 800 has a pillar shape and an example of material that may be used as the through electrode 800 includes copper.

A length of the through electrode 800 passing through the semiconductor chip 600 may be substantially equal to a thickness of the semiconductor chip 600. In the case that the length of the through electrode 800 is substantially equal to the thickness of the semiconductor chip 600, a connection member such as a solder is interposed between the through electrodes 800 of the adjacent semiconductor chips 600 to connect electrically the through electrodes 800 of the semiconductor chips 600 spaced apart from each other by the spacer 700.

Meanwhile, as shown in FIG. 7, the length of the through electrode 800 is longer than the thickness of the semiconductor chip 600 to connect electrically the through electrodes 800 of the adjacent semiconductor chips 600.

The conductive wire 900 connects electrically the chip selection pad 510 formed in the substrate 500 and the chip selection bonding pad 620 formed in each semiconductor chip 600 in the method shown in FIG. 1.

As is apparent from the above description, in the present invention, since data bonding pads of a plurality of stacked semiconductor chips are electrically connected through a through electrode and chip selection bonding pads and a chip selection pad of a substrate are electrically connected through a conductive wire, there is an advantage that data is input or output in high speed through the through electrode and fabrication process can be significantly shorten by connecting chip selection bonding pads and a chip selection pad through the conductive wire.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A stacked semiconductor package, comprising:
  a substrate having a connection pad and a chip selection pad;
  a plurality of semiconductor chips stacked over the substrate, each semiconductor chip having data bonding pads and chip selection bonding pads disposed over an edge thereof;
  a spacer interposed between each pair of adjacent semiconductor chips and spacing each pair of adjacent semiconductor chips apart from each other;
  through electrodes passing through corresponding data bonding pads and the semiconductor chip and electrically connecting the data bonding pads to the connection pad; and
  a conductive wire for connecting electrically the chip selection pad and the chip selection bonding pads.

2. The stacked semiconductor package of claim 1, wherein each through electrode projects from the semiconductor chip correspondingly to a thickness of the spacer.

3. The stacked semiconductor package of claim 1, wherein a length of the through electrode is substantially equal to a thickness of the semiconductor chip and a conductive connection member is interposed between the through electrodes spaced by the spacer.

4. The stacked semiconductor package of claim 3, wherein the conductive connection member is a solder.

5. The stacked semiconductor package of claim 1, wherein, when a number of the stacked semiconductor chips is $2^N$ (N is a natural number of more than 2), each semiconductor chip includes N chip selection bonding pads and chip selection redistribution units.

6. The stacked semiconductor package of claim 1, wherein the chip selection pad includes a ground voltage pad applied with a ground voltage (Vss) and a power voltage pad applied with a power voltage (Vcc).

* * * * *